United States Patent
Tsai et al.

(10) Patent No.: US 6,828,205 B2
(45) Date of Patent: Dec. 7, 2004

(54) METHOD USING WET ETCHING TO TRIM A CRITICAL DIMENSION

(75) Inventors: Ming-Huan Tsai, Hsinchu (TW); Ming-Jie Huang, Hsinchu (TW); Huan-Just Lin, Hsin-chu (TW); Hun-Jan Tao, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 245 days.

(21) Appl. No.: 10/072,798

(22) Filed: Feb. 7, 2002

(65) Prior Publication Data

US 2003/0148619 A1 Aug. 7, 2003

(51) Int. Cl.$^7$ .................... H01L 21/8222; H01L 21/302
(52) U.S. Cl. .................. 438/313; 438/314; 438/322; 438/323; 438/724; 438/757
(58) Field of Search ................. 438/313–317, 438/322, 323, 720, 724, 719, 745, 753, 754, 757, 328

(56) References Cited

U.S. PATENT DOCUMENTS

| | | | | |
|---|---|---|---|---|
| 4,269,654 A | * | 5/1981 | Deckert et al. ............. 438/756 |
| 5,431,770 A | * | 7/1995 | Lee et al. ................... 438/592 |
| 5,804,088 A | * | 9/1998 | McKee ....................... 216/47 |
| 6,036,875 A | * | 3/2000 | Lin ............................. 216/51 |
| 6,362,111 B1 | * | 3/2002 | Laaksonen et al. ......... 438/725 |
| 6,420,097 B1 | * | 7/2002 | Pike et al. .................. 430/313 |
| 6,498,061 B2 | * | 12/2002 | Divakaruni et al. ........ 438/243 |

OTHER PUBLICATIONS

Wolf et al., Silicon Processing for the VLSI Era, vol. 1, 1986, pp. 529, 539.*

* cited by examiner

Primary Examiner—Duy-Vu Deo
(74) Attorney, Agent, or Firm—Tung & Associates

(57) ABSTRACT

A method for using an isotropic wet etching process chemical process for trimming semiconductor feature sizes with improved critical dimension control including providing a hard mask overlying a substrate included in a semiconductor wafer said hard mask patterned for masking a portion of the substrate for forming a semiconductor feature according to an anisotropic plasma etching process; isotropically wet etching the hard mask to reduce a dimension of the hard mask prior to carrying out the anisotropic plasma etching process; and, anisotropically plasma etching a portion of the substrate not covered by the hard mask to form the semiconductor feature.

19 Claims, 1 Drawing Sheet

METHOD USING WET ETCHING TO TRIM A CRITICAL DIMENSION

FIELD OF THE INVENTION

This invention generally relates to a method for etching semiconductor features and more particularly to a method for using an isotropic wet etching process chemical process for trimming semiconductor feature sizes with improved critical dimension control.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

For example, fabrication of a complementary metal-oxide-semiconductor (CMOS) integrated circuit involves numerous processing steps. CMOS technology uses metal oxide semiconductor field effect transistors (MOSFET) to form, for example, logic elements. In forming a MOSFET, a gate structure is central to the operation of the device. For example, a gate dielectric (gate oxide) of for example, silicon dioxide, is formed over a semiconductor substrate of, for example, silicon which is doped with either n-type or p-type impurities. A gate conductor is then formed over the gate dielectric, and dopant impurities are introduced into the substrate to form a source and drain.

A driving trend in modern integrated circuit manufacture is to produce transistors having feature sizes as small as possible. Many modern day processes employ features, such as gate conductors, which have less than 0.5 micron critical dimension (CD). For example the gate length is the smallest feature of the MOSFET patterned by lithography and etching. Optical lithography has been able to provide generations of feature size reduction by using wavelengths a short as 193 nm for sub 0.5 micron lithography. Future feature size reductions by x-ray, extreme UV, and electron beam may prove costly and difficult. Gate length and gate oxide thickness are exemplary critical dimensions in gate structure manufacturing. Gate length is usually determined by the lithography and etching capability of manufacturing techniques. As such, sub-lithographic wet etching methods or combinations of processes including lithography, dry etching and wet etching, present attractive alternatives as critical dimensions are reduced.

In semiconductor device fabrication, polysilicon and silicon dioxide are commonly used to form gate electrodes and gate dielectrics for metal-oxide-semiconductor (MOS) transistors. As device dimensions have continued to scale down, the thickness of the $SiO_2$ layer has also decreased to maintain the same capacitance between the gate and channel regions. A thickness of the gate oxide layer of less than 2 nanometers (nm) is expected in the future.

For example, referring to FIG. 1, fabrication of a CMOS transistor including a gate structure 10 begins by lightly doping a single crystal silicon substrate either n-type or p-type. The specific area where the transistor will be formed is then electrically isolated from other areas on the substrate using various isolation structures. In modern fabrication technologies, the isolation structures may include, for example, shallow trenches (not shown) in the substrate filled with dielectric oxide which acts as an insulator. A gate dielectric (gate oxide) layer is then formed by oxidizing the silicon substrate. Oxidation is typically performed by thermal oxidation a rapid-thermal-anneal ("RTA") process. A layer of polycrystalline silicon ("polysilicon") is then deposited over the gate dielectric.

Typically, one or more layers of hard mask material such as silicon nitride or silicon oxynitride are formed over the polysilicon prior to patterning and etching the gate structure. In addition, a dielectric anti-reflective coating of for example, silicon oxynitride may be formed over the hard mask to reduce undesired light reflections from the hard mask which serve to expose undesired areas in an overlying photoresist layer used to pattern the etching area to form the gate structure.

The polysilicon may be rendered conductive by doping it with ions from an implanter or using a thermally activated diffusion process. The gate structure is then patterned by using a photolithographic process to pattern the hard mask material followed by exposure, development, and etching. The gate structure is then etched to form the gate structure 10 shown in FIG. 1 including gate oxide 12, gate conductor 14, hard mask layer 16. Subsequently, source and drain regions are formed by doping the area on either side of the gate structure, for example source region 18A and drain region 20A, via ion implantation, with a dosage n-type or p-type dopant. More heavily doped regions may later be formed over regions 18B and 20B by forming silicon dioxide spacers (not shown) over regions 18A and 20A followed by a heavier doping dosage. If the source and drain regions are doped n-type, the transistor is referred to as NMOS, and if the source and drain regions are doped p-type, the transistor is referred to as PMOS. A channel region 22 between the source and the drain is protected from the implant species by the gate structure. When voltage above a certain threshold is applied to the gate of an enhancement-mode transistor, the channel between the source and drain becomes conductive and the transistor is activated.

As semiconductor feature sizes decrease, for example, the width of a gate structure, more sophisticated photolithography techniques have been required to pattern etching masks for anisotropically plasma etching smaller semiconductor features such as gate structures while maintaining acceptable critical dimension control. As a result, the associated high costs of photolithographic patterning steps to form device sizes having, for example, device features less than 0.1 microns has been a concern in the semiconductor manufacturing art.

Wet etch techniques on the other hand, while demonstrating a high selectively for one material relative to other materials, are generally isotropic, etching at similar rates in all directions, making control of critical dimension variations of semiconductor features over a semiconductor wafer surface (CD bias) more difficult. Wet etch chemistries, however, have been found to be especially suitable for blanket etches of polysilicon, oxides, and metal nitrides. For example, hot phosphoric acid has high selectivity for metal nitrides, for example, silicon nitride and silicon oxynitride, however the hot temperatures (about 150° C.) required of the phosphoric acid have restricted its use to wet bench techniques where the target etch surface is typically immersed in the hot phosphoric acid with mechanical agitation. In addition to the added cost due to the complexity of wet bench apparatus required for safety and other reasons, such techniques have proven unable to achieve the critical dimension control required for present semiconductor feature sizes.

There is therefore a need in the semiconductor processing art to develop wet etching methods that are economically feasible and that are able to achieve acceptable critical dimension control as device feature sizes diminish.

It is therefore an object of the invention to develop wet etching methods that are economically feasible and that are able to achieve acceptable critical dimension control as device feature sizes diminish while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for using an isotropic wet etching process chemical process for trimming semiconductor feature sizes with improved critical dimension control.

In one embodiment of the present invention, the method includes providing a hard mask overlying a substrate included in a semiconductor wafer said hard mask patterned for masking a portion of the substrate for forming a semiconductor feature according to an anisotropic plasma etching process; isotropically wet etching the hard mask to reduce a dimension of the hard mask prior to carrying out the anisotropic plasma etching process; and, anisotropically plasma etching a portion of the substrate not covered by the hard mask to form the semiconductor feature.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method according to the present invention is more clearly described by referring to FIGS. 2A–2D, and FIGS. 3A and 3B.

Figure 1:
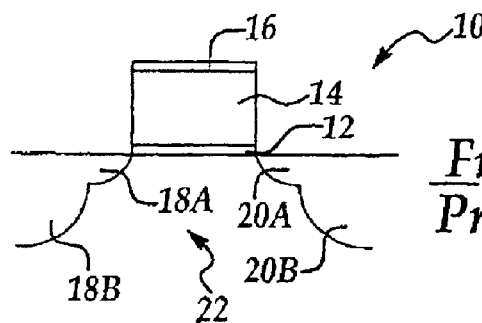
FIG. 1 is a representative side view of a cross sectional portion of a gate structure forming a portion of a CMOS transistor according to the prior art.
Figure 2A:
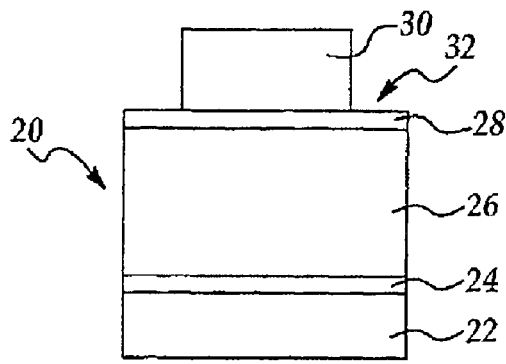
FIGS. 2A–2D are representative side view cross sectional representations of the formation of portions of an exemplary gate structure according to the present invention.

Referring to FIG. 2A, a side view cross sectional representation is shown of a portion of a semiconductor wafer 20 at a stage in manufacturing prior to etching a gate structure to form, for example, a MOSFET device.

In reaching this stage of manufacture, the process typically begins by lightly doping a single crystal silicon to form an n-type or p-type substrate 22. The specific area where the transistor will be formed is then electrically isolated from other areas on the substrate using various isolation structures, for example, a shallow trench (not shown) surrounding the area filled with an insulating dielectric. A gate dielectric (gate oxide) layer 24 is then formed by, for example, oxidizing the silicon substrate. Oxidation is typically performed by thermal oxidation using a rapid-thermal-anneal ("RTA") process at temperatures of about 1000° C. The thickness of the gate dielectric may range from a few nanometers to about 12 nanometers.

A layer of polycrystalline silicon ("polysilicon") 26 is then formed over the gate dielectric 24, for example, by a conventional a low pressure chemical vapor deposition (LPCVD) process. The polysilicon may optionally be doped with ions from an implanter or a thermal diffusion process. A layer of hard mask material 28, for example, silicon nitride or silicon oxynitride is then formed over the polysilicon. The hard mask is typically deposited by a conventional CVD process, for example plasma enhanced CVD (PECVD). The hard mask layer 28 is used for selectively etching polysilicon 26 to form a gate conductor included the gate structure. One advantage of using silicon nitride, for example, is that it can be prepared by PECVD to have a low compressive stress which allows it to be subjected to environmental stresses without peeling and cracking. Prior to forming photoresist layer 30 over the hard mask layer 28, an anti-reflective coating (ARC) layer (not shown) is optionally deposited over the hard mask to reduce undesired light reflections from the hard mask 28 or the hard mask-polysilicon interface. Such reflections act to expose the overlying photoresist layer 30 leading to undercutting at the base of the photoresist pattern upon development causing a loss of critical dimension and thereby compromising functional electrical properties. The anti-reflective coating may include, for example, silicon oxynitride, silicon nitride or titanium nitride deposited by PECVD, the thickness being in the range of about 100 to about 200 nanometers. Following deposition of the ARC layer, photoresist layer 30 is deposited and photolithographically patterned by conventional techniques to define a gate structure.

Figure 2B:
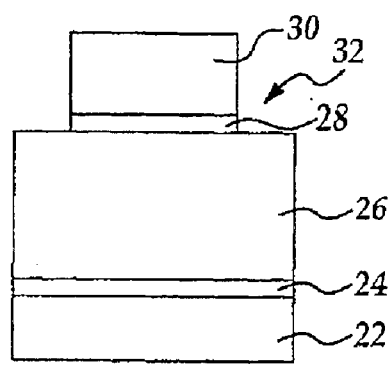

In the method according to the present invention, the exposed hard mask region 32, exposed following patterning of the photoresist layer to outline the gate structure, is subjected to an anisotropic plasma etch process also known as a reactive ion etch (RIE) process. The plasma etch process preferably includes conventional chemistries that have a high selectivity of metal nitride, for example, silicon nitride to silicon. Suitable chemistries include $CHF_3/O2$, $CH_2F_2$, or $CH_3F$. As shown in FIG. 2B, in the method according to the present invention, the exposed hard mask region 32 is anisotropically etched through to the polysilicon layer 26 to form the outline of a gate structure. Following, the plasma etching step, the photoresist is stripped (removed) according to a conventional ashing or wet chemical process to leave hard mask layer 28 overlying the polysilicon layer 26 and outlining the upper portion of a gate structure.

Figure 2C:
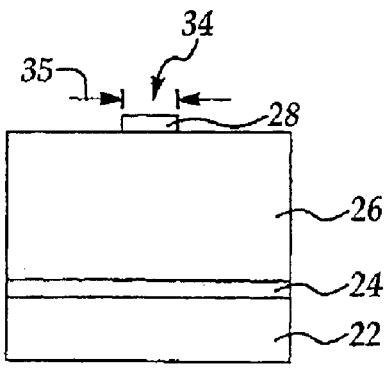

According to one embodiment of the present invention, a semiconductor wafer including the patterned hard mask layer 28 is subjected to an isotropic wet etching process to isotropically trim down the hard mask layer 28 to form a reduced dimension portion 34 outlining a gate structure as shown in FIG. 2C. The hard mask layer 28 is reduced in dimension for example, including reducing a width of the gate structure from about 100 nm to between about 10 nm to about 50 nm, more preferably to about 30 nm, as shown in FIG. 2C, the width dimension being indicated by dimensional arrow 35. Preferably the isotropic wet etching process is carried out by placing the wafer on a conventional spin chuck as used in a single wafer spray etching process. It will be appreciated that the wet etching process according to the present invention may use any conventional wet etching process, for example immersion or spraying. A spraying process, for example, using a single wafer spinning chuck to spin the semiconductor wafer while simultaneously spraying the semiconductor etching surface with a source of etching solution is preferred since it has been found to give superior etching uniformity and control of critical dimension (CD) bias across a semiconductor wafer surface.

Figure 2D:
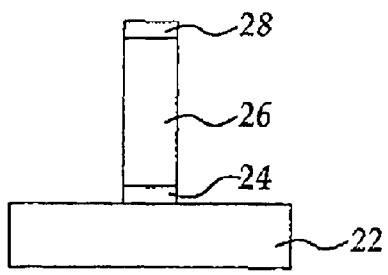

Following the isotropic wet etching process to reduce dimension of a hard mask defining a semiconductor feature dimension, for example, a gate structure width, a conventional anisotropic plasma etching procedure may be carried out on the exposed portions of the semiconductor wafer substrate (areas not covered by the hard mask layer 28) to complete the formation of the semiconductor feature, for example, a gate structure, as shown in FIG. 2D.

According to another embodiment of the present invention, it has been found that a mixture of hydrofluoric acid (HF) and glycol is preferably used as the etching solution in the isotropic wet etching process according to the present invention. The mixture of hydrofluoric acid (HF) and glycol is preferred to achieve good selectivity and to maintain etching uniformity to achieve CD bias control at much lower temperatures compared to the prior art. For example, the wet etching process may be carried out at temperatures from about 20° C. to about 90° C. As a result, conventional wet cleaning apparatus may be used for the wet etching process compared to more elaborate requirements in the prior art for handling hot phosphoric acid at temperatures of about 150° C. to about 180° C. However, it will be appreciated that according to the present invention, conventional wet etching procedures using immersion techniques and wet etching solutions such as hot phosphoric acid or hydrofluoric acid to may be used for the isotropic wet etch as well. Preferably, however, according to one embodiment of the present invention, the isotropic wet etch procedure of the present invention is carried out with a spraying (spin-spray) method using a hydrofluoric acid (HF) and glycol etching solution mixture having a temperature range of about 20° C. to about 90° C.

Preferably, in one embodiment, the etching solution includes a mixture within a range of concentration from about a ratio of 1 part HF to 10 parts glycol to about a ratio of 1 part HF to 100 parts glycol. In another embodiment according to the present invention, the etching solution includes a water-diluted hydrofluoric acid (HF) solution within a range of concentration of about a ratio of 20 parts $H_2O$ to 1 part HF to about a ratio of 400 parts $H_2O$ to 1 part HF.

According to one exemplary embodiment of the present invention, the etching solution is sprayed onto the semiconductor wafer surface (hard mask layer) while spinning the wafer at about 300 to about 1000 RPM. Preferably, the spraying rate of the etching solution is in the range of about 50 to about 250 ml/min. Preferably, the wet etch procedure according to the present invention using the spraying (spin-spray) process is carried out over a time period of from about 30 seconds to about 2 minutes. It will be appreciated that the etch rate and consequently the etching time depends upon a combination of several variables such as spin rate, etching solution, etching solution concentration, and etching solution temperature.

Optionally, the spraying (spin-spray) etching procedure according to the present invention may be carried out in more than one step, for example, altering the parameters including etching solution concentration and spin rate to achieve faster etch rates over a portion of the etching dimension, followed by a more mild etching solution concentration with a slower etch rate as critical dimension limits are approached.

Figure 3A:
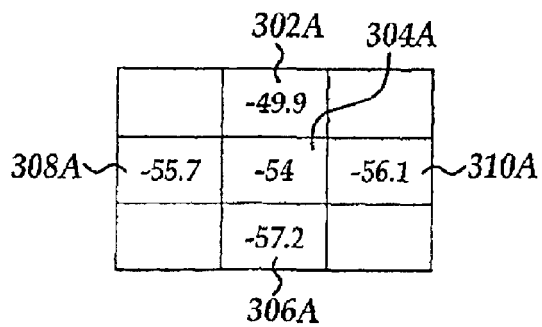
FIGS. 3A and 3B are representative grid sections of a semiconductor surface after being subjected to wet etching processes according to the present invention.
Figure 3B:
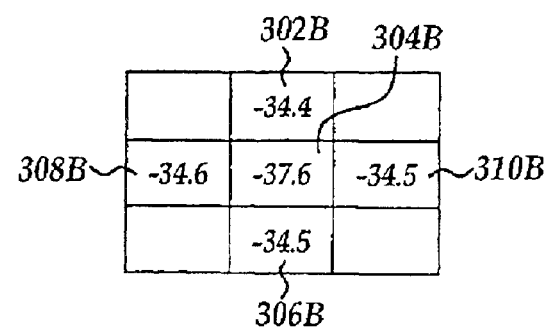

Turning to FIGS. 3A and 3B, square grids are shown representing relative variations or CD bias in a semiconductor surface following a wet etching procedure. In FIG. 3A is shown representative dimensional measurements in nanometers showing a reduction in a gate dimension (width) taken at representative portions of the wafer surface following an immersion wet bench procedure using hot phosphoric acid as the etching solution. Grid section 302A, representing an upper portion of a wafer which is immersed last (top) in an immersion procedure that varies in CD bias through grid section 304A, representing a central portion of the wafer, to grid section 306A, representing the lower portion of the wafer which is immersed first (bottom). The variation in CD bias from the top (grid section 302A) of the wafer to the bottom of the wafer (grid section 306A) shows a variation in etching corresponding with the total time the wafer is immersed according to an immersion procedure. The semiconductor wafer shows better etching uniformity across the central portion of the wafer e.g., grid sections 308A, 304A and 310A, corresponding to about an equal immersion time.

By contrast, FIG. 3B, reflecting the results of a wet etching procedure carried out using a spraying (spin-spray) procedure, shows a significantly improved etching uniformity over the wafer surface, at e.g., grid sections 302B, 304B, 306B, 308B, 310B, with a lower standard deviation and variance over the wafer surface. For example, using an immersion wet bench etching procedure results in a variation of 3%–5% of CD measurements within the wafer, while using the spin-spray etching procedure gives a CD measurement variation of about 1%–2.5% within the wafer. Thus, the spraying (spin-spray) procedure is preferred according to the present invention, resulting in a greater uniformity in isotropic wet etching across the wafer thereby allowing better control of a critical dimension of a semiconductor feature, for example, a gate structure.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for isotropically trimming semiconductor feature sizes with improved critical dimension uniformity over a process wafer surface comprising the steps of:
   providing a substrate comprising an uppermost patterned hard mask nitride layer free of overlying photoresist;
   isotropically wet etching the patterned hard mask to isotropically reduce the patterned hard mask dimensions wherein the wet etching rate is reduced as a critical dimension is approached and wherein the wet etching process is selected from the group consisting of spin-spray etching and immersion etching; and,
   plasma etching through a thickness portion of the substrate according to the patterned hard mask following the wet etching process to form the semiconductor feature.

2. The method of claim 1, wherein the hard mask comprises a material selected from the group consisting of silicon nitride, silicon oxynitride, and titanium nitride.

3. The method of claim 1, wherein the substrate comprises a polysilicon layer overlying a silicon substrate.

4. The method of claim 1, wherein the spin-spray wet etching process comprises simultaneously spinning the semiconductor wafer while spraying a wet etching solution onto the hard mask.

5. The method of claim 4, wherein simultaneously spinning comprises a spin rate of about 300 to about 2000 revolutions per minute.

6. The method of claim 4, wherein the wet etching solution comprises hydrofluoric acid (HF) and glycol.

7. The method of claim 6, wherein the wet etching solution has a temperature of about 20° C. to about 90° C.

8. The method of claim 7, wherein the wet etching solution comprises about of 1 part HF to 10 parts glycol to about 1 part HF to 100 parts glycol.

9. The method of claim 4, wherein the wet etching solution comprises ($H_2O$) and hydrofluoric acid (HF).

10. The method of claim 4, wherein the wet etching solution comprises HF.

11. The method of claim 1, wherein the step of isotropically wet etching comprises immersion in a wet etching solution comprising phosphoric acid at a temperature of about 150° C. to about 180° C.

12. The method of claim 1, wherein the hard mask dimensions following the isotropic wet etching process comprise a width reduced from about 50 percent to about 90 percent.

13. A method for forming gate structures with improved CD uniformity across a semiconductor wafer process surface comprising the steps of:

providing a semiconductor wafer comprising a nitride layer overlying a polysilicon containing layer;

photolithographically patterning a photoresist layer over the nitride layer to form a patterned etching surface;

plasma etching through a thickness of the nitride layer to form a hard mask;

removing the photoresist layer to form a wet etching surface comprising sidewalls and an upper surface of the hard mask;

isotropically wet etching the hard mask according to a spin-spray process comprising HF to isotropically reduce the hard mask dimensions wherein the wet etching rate is reduced as a critical dimension is approached; and, plasma etching through the polysilicon layer according to the hard mask to form a gate structure.

14. The method of claim 13, wherein the step of isotropically wet etching comprises an etching solution with a temperature of about 20° C. to about 90° C.

15. The method of claim 13, wherein the step of isotropically wet etching comprises the steps of simultaneously spinning the semiconductor wafer while spraying an etching solution onto the wet etching surface.

16. The method of claim 15, wherein simultaneously spinning comprises a spin rate of about 300 to about 2000 revolutions per minute.

17. The method of claim 13, wherein the step of isotropically wet etching comprises a wet etching solution comprising HF and glycol.

18. The method of claim 17, wherein the wet etching solution comprises 1 part HF to 10 parts glycol to about a ratio of 1 part HF to 100 parts glycol.

19. The method of claim 13, wherein the hard mask dimensions following the isotropic wet etching process comprise a width reduced from about 50 percent to about 90 percent.

* * * * *